United States Patent [19]

Ferro et al.

[11] 4,047,220
[45] Sept. 6, 1977

[54] BIPOLAR TRANSISTOR STRUCTURE HAVING LOW SATURATION RESISTANCE

[75] Inventors: Armand P. Ferro, Schenectady, N.Y.; Bruno F. Kurz, deceased, late of Schenectady, N.Y., by Elizabeth Kurz-Beerli, executrix, also known as Elizabeth Kurz Chinoy

[73] Assignee: General Electric Company, Schenectady, N.Y.

[21] Appl. No.: 644,338

[22] Filed: Dec. 24, 1975

[51] Int. Cl.² .................................... H01L 27/10
[52] U.S. Cl. ............................ 357/48; 357/36; 357/89; 357/90; 148/175; 148/187
[58] Field of Search ................ 357/48, 36, 89, 90

[56] References Cited

U.S. PATENT DOCUMENTS

| 3,460,006 | 8/1969 | Strull | 357/48 |
| 3,665,266 | 5/1972 | Drozdowicz et al. | 357/36 |

Primary Examiner—William D. Larkins
Assistant Examiner—Marcus S. Rasco
Attorney, Agent, or Firm—Jerome C. Squillaro; Joseph T. Cohen

[57] ABSTRACT

A triple diffused interdigitated NPN transistor formed in an isolated N-epitaxial pocket of an otherwise standard NPN bipolar junction isolated integrated circuit. The N-type diffused collector pocket in the N-epitaxial layer lowers collector resistance of the triple diffused NPN device.

7 Claims, 4 Drawing Figures

BIPOLAR TRANSISTOR STRUCTURE HAVING LOW SATURATION RESISTANCE

The present invention relates to semiconductor devices and more particularly to monolithic integrated circuit structures including bipolar semiconductor devices some of which are characterized by a high voltage collector-to-base breakdown capability and others of which are characterized by a low voltage breakdown capability, but with low saturation resistance characteristics.

The fabrication of semiconductor devices in monolithic integrated circuit form have provided the circuit designer with a wide range of capabilities in developing electrical circuits useful for performing numerous functions. Generally, however, the fabrication of integrated circuits on a specific resistivity substrate requires compromises in device characteristics where devices of substantially different power or voltage handling capability are required. For example, the requirement for a low saturation voltage drop in a high current, low voltage signal transistor is not easily achieved in an integrated circuit structure including high voltage, high current power transistors, the characteristics of which dictate the type of semiconductor material required for the integrated circuit. For example, where it is desired to fabricate a transistor having a collector-to-base breakdown voltage of approximately 500 volts, it is generally necessary to select a semiconductor substrate having a epitaxial layer formed thereon with a resistivity of at least 10 ohm-cm and a thickness of approximately 45 to 50 microns. On the other hand, if it is desired to construct a semiconductor device having only a 50 volt collector-to-base breakdown voltage, an epitaxial layer of 1 ohm-cm and approximately 10 to 12 microns would provide optimum performance.

Where it is desired to provide both high voltage power devices (i.e., in excess of several hundred volts collector-to-base breakdown voltage) and low voltage signal devices (i.e., less than one hundred volts collector-to-base breakdown voltage) on the same integrated circuit substrate, it is necessary to select a substrate which will meet the more stringent demands of the high voltage, high power device and compromise the characteristics of the low voltage signal device. This compromise device generally includes an unacceptably high collector series resistance which results from the device geometry.

It is therefore an object of this invention to provide on a single monolithic integrated circuit high voltage, high power devices and low voltage signal devices in which the low voltage signal devices are characterized by a low saturation resistance.

It is another object of this invention to provide a bipolar transistor structure having low saturation resistance.

Briefly, in accordance with a preferred embodiment of the invention, a monolithic integrated circuit structure including high voltage power and low voltage signal devices are provided. The low voltage signal devices are characterized by a low saturation resistance which is achieved in accordance with this invention by interdigitated base, collector and emitter regions and wherein the lateral spreading resistance of the collector region underlying the base region is utilized to reduce the collector series resistance.

In practicing the invention, a high resistivity epitaxial layer suitable for the fabrication of high voltage power devices is formed over a substrate and isolation regions are formed from the surface and through the epitaxial layer to the substrate to isolate a portion of the epitaxial layer from other portions of the epitaxial layer. Within the isolated region, a region of lower resistivity than the epitaxial region is formed as the collector region of the device. A plurality of base regions are formed in the collector region and a like plurality of emitter regions are formed in the base regions. Additional collector regions are interdigitated with the plurality of base regions to provide a plurality of current paths between the collector and base regions. These parallel current paths reduce the series collector resistance normally associated with thick collector regions, wide buried layers and deep collector contact diffusions.

These and other objects and advantages of the invention will become more apparent from the following detailed description taken in conjunction with the accompanying drawings in which.

Although the semiconductor device of this invention will have many possible applications, one of the presently anticipated applications for this invention is its use in dc/ac inverter applications wherein the inverter operates at a relatively high frequency (e.g., 25 kHz). This high frequency ac output from the inverter would then be used to power an ac load or the output of the inverter can be rectified and filtered appropriately to provide a dc output voltage, if desired.

Figure 1:
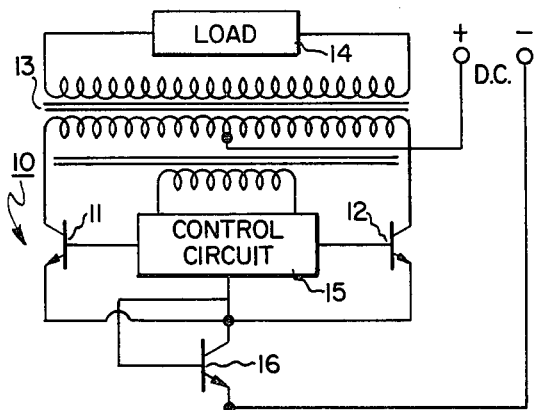
FIG. 1 is an electrical schematic diagram of a typical circuit configuration employing high voltage power and low voltage signal transistors in a high frequency inverter.

By way of example, FIG. 1 illustrates a typical inverter circuit in which the semiconductor devices of the present invention may be utilized. Specifically, FIG. 1 illustrates an inverter 10 including high voltage power transistors 11 and 12 with their collector electrodes connected to the primary winding of a transformer 13 which also includes a secondary winding connected to a load 14. The transformer 13 further includes a tertiary winding connected to a control circuit 15 which controls the conduction of transistors 11, 12 and a low volage signal transistor 16 having its collector electrode connected to the emitter electrodes of the switching transistors. As is typical of many inverters of the type illustrated in FIG. 1, alternate conduction of transistors 11 and 12 causes current flow through the primary winding of the transformer 13 which in turn induces a voltage in the secondary winding for transferring power to the load 14. Since the inverter of FIG. 1 is merely intended to illustrate one of many possible uses of the present invention, no further comments will be made regarding the operation of the inverter.

Figure 2:
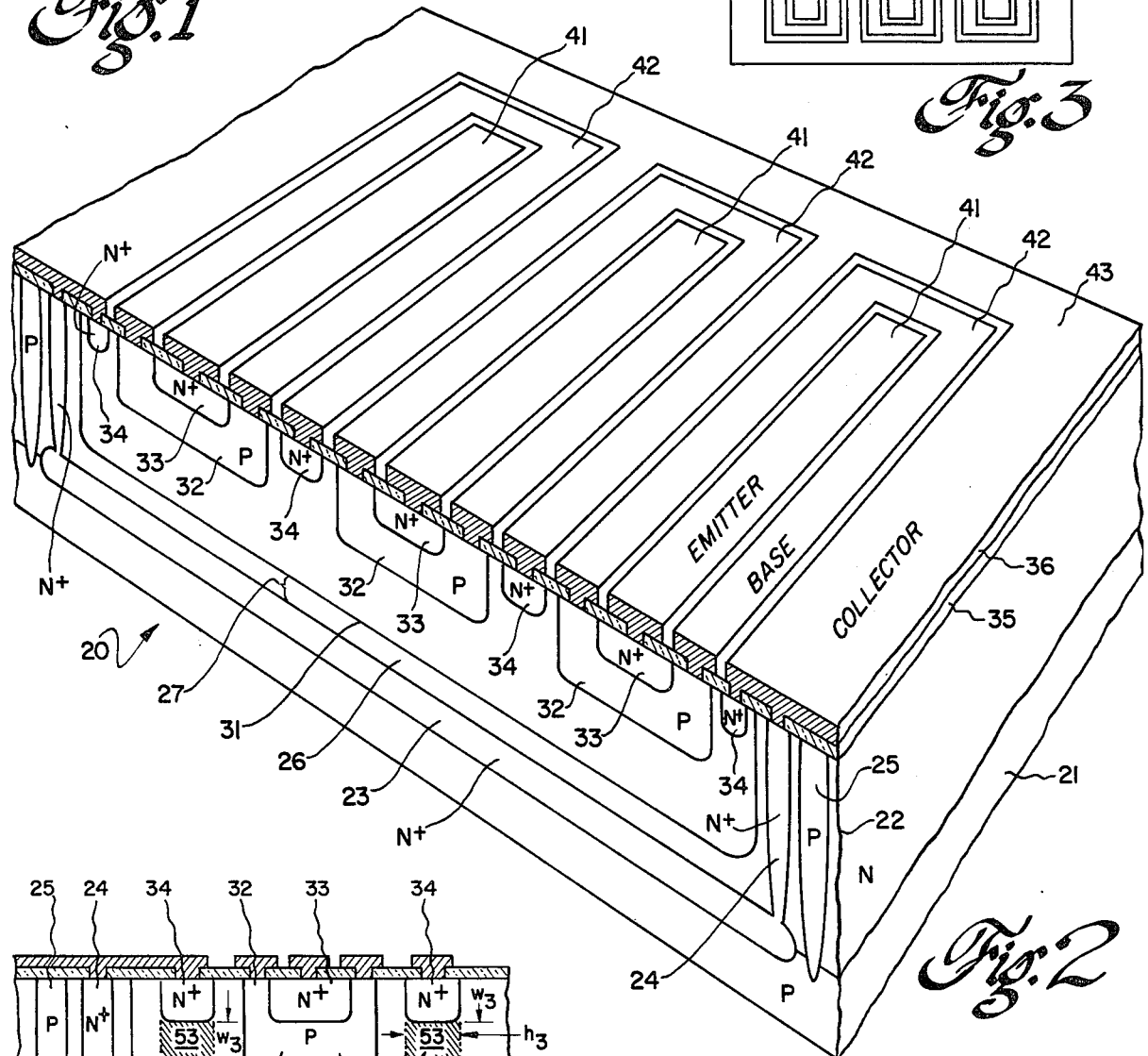
FIG. 2 is a perspective view, in partial cross-section of an embodiment of the present invention.

FIG. 2 illustrates an embodiment of the present invention in which a low voltage bipolar transistor 20 includes interdigitated base, emitter and collector electrodes. The bipolar transistor 20 includes a semiconductor substrate 21 of a first conductivity type, such as P-type substrate. An epitaxial layer 22 of a second conductivity type (N-type) is formed on a major surface of the substrate 21. A buried layer 23 of N+ conductivity type is formed at the interface of the substrate 21 and the epitaxial layer 22. Typically, the buried layer 23 is formed by well-known diffusion techniques.

A deep collector contact (or sinker) region 24 of N+ conductivity type extends from the surface and continues through the epitaxial layer 22 and makes contact with the buried layer 23. Also extending from the surface of the epitaxial layer and through the epitaxial layer to the substrate 21 is a P-type region 25 which completely surrounds the collector region (including the buried layer 23 and collector region 24) and isolates this portion of the epitaxial layer 22 from all other portions of the epitaxial layer. Accordingly, the semiconductor device formed within the isolation region or pocket region 26 is electrically separate and apart from other semiconductor devices which may be physically included on the same substrate.

As described above, where high voltage power semiconductor devices are to be fabricated in monolithic integrated circuits, the voltage and current carrying capabilities of the desired device dictate, among other things, the relative thickness of the epitaxial layer and the resistivity thereof. Typically, for a power transistor having a collector-to-base breakdown voltage of 500 volts and approximately 1 ampere current-carrying capability, it is necessary to select a resistivity of approximately 15 ohm-cm and an epitaxial layer thickness of approximately 45 microns. While these parameters are useful in providing high voltage power devices, the fabrication of low voltage signal devices in such an epitaxial layer by prior art techniques would result in the fabrication of a transistor characterized by a high collector series resistance including the bulk collector resistance, the buried layer resistance and the deep collector contact resistance. Hence, the resulting low power signal semiconductor would exhibit high saturation resistance, a clearly undesirable characteristic for a transistor operated in a switching mode, where the high saturation resistance would undesirably increase power losses in the device.

In accordance with the present invention, the aforementioned difficulties are overcome by inclusion of a region of lower resistivity in the isolated pocket region 26. FIG. 2 illustrates this region of lower resistivity by the numeral 31, which depicts the outline of this lower resistivity region which, for example, may be formed by a closed tube or capsule diffusion technique. If it is desired to provide a low cost process, then certain technical considerations may limit the overall effectiveness of this step. For example, these deep diffusions must be weighted against the required low surface concentrations and reasonable diffusion times, including the costs associated with the diffusion times.

By way of specific example, where it is desired to have a single base diffusion step for both power and signal devices, then the surface concentration of region 31 cannot exceed that of the P-type base diffusion chosen for the power device characteristics. Otherwise, type conversion will not occur. The surface concentration value for the P-type base diffusion is typically $10^{18}$ atoms/cm$^3$. Hence, the average resistivity near the surface is approximately 0.3 ohm-cm, but increases to the background value of resistivity (i.e., 10–12 ohm-cm). Thus, the average resistivity over the pocket region 31 may be approximately 1 ohm-cm. Also, for similar practical reasons, the depth of pocket region 31 may not extend fully to the buried layer 23. Therefore, under some conditions, there may be a region 27 of uniform resistivity formed by the unmodified epitaxial layer 22.

Figure 3:
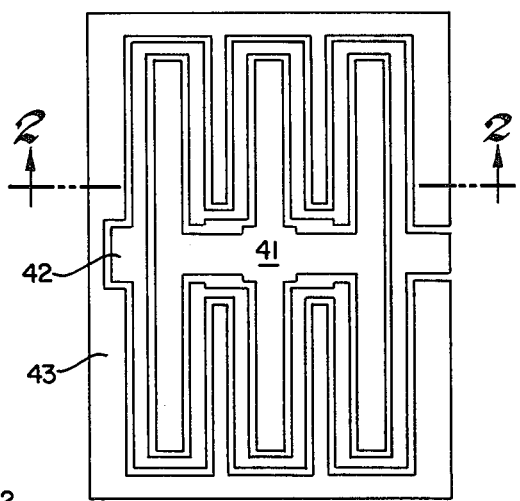
FIG. 3 is a plan view of the embodiment of the invention illustrated in FIG. 2.

Within the lower resistivity pocket region 31, a plurality of base regions 32 are formed by P-type diffusion, for example. As illustrated, the P-type base regions 32 are elongated and, as further illustrated in the plan view of FIG. 3, are interconnected by a common P-type region and by an overlying conductive grid 42. A first plurality of N+ conductivity type regions 22 are also formed, by diffusion, for example, into the P-type base regions 32, forming the emitter region of the device. A second plurality of N+ conductivity type regions 34 (which may be formed simultaneously with regions 33) are formed between the base regions 32 and comprise a portion of the collector region of the semiconductor device.

By way of brief summary, the semiconductor device illustrated in FIG. 2 includes a bipolar transistor comprising a collector region including the buried layer 23, the deep collector contact region 24 and the plurality of N+-conductivity type collector regions 34 formed in the lower resistivity region 31 and interdigitated with the base regions 32.

As illustrated in FIG. 2, the surface of the epitaxial layer 22 is selectively covered with an insulating material 35, such as silicon dioxide, and a selectively patterned conductive material such as aluminum, molybdenum, polycrystalline silicon, or other suitable electrode materials. The resulting electrode configuration includes interdigitated base, emitter and collector means for making contact to the underlying semiconductor regions.

The interdigitated arrangement of electrodes is illustrated more clearly in FIG. 3 which is a plan view of the embodiment of the invention illustrated in FIG. 2. The emitter, base and collector electrodes are designated by the reference numerals 41, 42 and 43, respectively. It should be appreciated that FIG. 3 illustrates only a portion of a monolithic integrated circuit including numerous other components including, for example, high voltage power transistors useful in the circuit configuration illustrated in FIG. 1.

Those skilled in the art will better appreciate the significant improvement in saturation resistance obtained by the interdigitated bipolar structure described above by first considering the manner in which the improvement is obtained. More specifically, the total collector resistance $R_C$, is equal to the parallel combination of two resistive components, the series resistance normally associated with conventional bipolar integrated circuits, designated as $R_{NT}$, and the spreading resistances associated with the regions 51, 52 and 53, illustrated in FIG. 4 and described in greater detail below.

Figure 4:
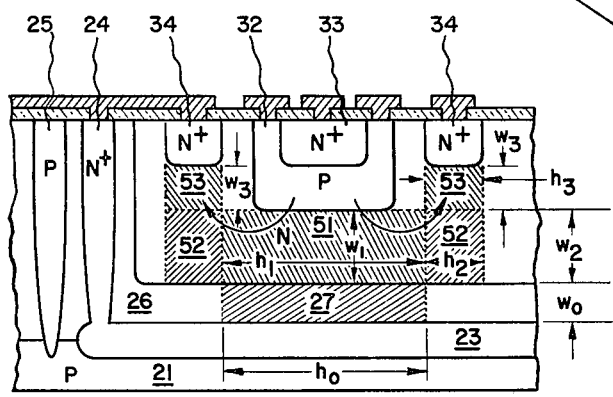
FIG. 4 is a partial sectional view of the embodiment of FIG. 2 illustrating the spreading resistance between alternately spaced collector and base contacts.

With reference to FIG. 4, the resistance $R_{NT}$ is equal to the sum of the resistances including the $R_{CC}$, the pocket region resistance, illustrated as region 51; $R_{CE}$, the unmodified epitaxial collector resistance, illustrated as region 27 in FIG. 4; $R_{BL}$, the lateral buried layer resistance; and $R_{DC}$, the deep collector contact resistance. The total collector resistance $R_C$, is approximately equal to $R_{NT}$ shunted by a parallel resistance comprising a sum $R_S$ of the spreading resistances between alternately spaced collector and base regions, illustrated by the regions 51, 52 and 53 of FIG. 4. The resistance of region 51 per unit length is $R_{51} = \rho_1 h_1 / 12 w_1$, the resistance of region 52 per unit length is $R_{52} =$ $p_2 h_2/3 w_2$, and the resistance of region 53 per unit length is $R_{53} = p_3 w_3/h_3$, where $P_1$, $P_2$ and $P_3$ are equal to the resistivities of the semiconductor material in the 51, 52 and 53, respectively. Thus, the parallel resistance $R_S$ is equal to $R_{51} + (R_{52} + R_{53})/2$. The total collector resistance $R_C$ is then $R_C = R_{NT} R_S/(R_{NT} + R_S)$.

For practical values of diffusion parameters and transistor design, the resistances associated with the deep collector contact, $R_{DC}$, and buried layer, $R_{BL}$, are small compared to the collector region resistances $R_{CE}$ and $R_{CC}$ associated with regions 27 and 51, respectively. Furthermore, the resistance $R_{53}$ associated with regions 53 is also negligible. Accordingly, the total collector resistance $R_C$ becomes almost wholly dependent on the characteristics of regions 27, 51 and 52 and is approximated by the following equation:

$$R_C \approx (R_{CC} + R_{CE}) \parallel (R_{51} + \frac{R_{52}}{2})$$

Obviously, practical line widths and geometries ultimately limit the reduction of the parallel resistance, $R_S$. However, for the example cited above where the epitaxial layer resistivity is 22 ohm-cm (without a pocket region 31 of lower resistivity), the parallel resistance $R_S$ is reduced to approximately 1/10 the value associated with an unmodified collector region resistance. Where the collector region resistance is reduced to approximately 1 ohm-cm by the capsule diffusion producing the pocket region 31, the total collector resistance $R_C$ is reduced still further.

From the foregoing description, those skilled in the art can readily appreciate that the interdigitated base, emitter and collector structure provides low collector saturation resistance by utilizing the spreading resistance characteristics between alternately spaced collector and base contacts. The parallel current paths, as illustrated in FIG. 4, reduce the normal series collector resistance associated with a thick collector region, a wide buried layer and a deep collector contact diffusion, necessitated by a monolithic integrated structure including both high voltage power and low voltage signal devices.

Those skilled in the art can readily appreciate that the embodiments of our invention described above are merely illustrative of the invention. Numerous modifications and variations thereof are possible. For example, whereas the interdigitated collector regions are illustrated as only extending partially into the epitaxial layer, obviously deeper diffusions extending directly to the buried layer may be utilized to advantage where desired. Similarly, other modifications and variations may be made without departing from the spirit and scope of the present invention as defined by the appended claims.

What is claimed as new is:

1. A monolithic semiconductor device structure characterized by low saturation resistance comprising:
    a first conductivity type substrate;
    a second conductivity type epitaxial layer on said substrate;
    a buried layer region of second conductivity type and substantially lower resistivity than said epitaxial layer selectively positioned between said epitaxial layer and said substrate;
    a narrow region of first conductivity type extending from the surface of said epitaxial layer through said layer to said substrate and isolating a portion of said epitaxial layer from other portions of said substrate and epitaxial layer;
    a deep collector contact region of second conductivity type extending from the surface of said epitaxial layer, partially through said layer and contacting said buried layer region;
    a pocket region of second conductivity type and substantially lower resistivity than said epitaxial layer formed within the isolated region, said pocket region comprising the collector region of said semiconductor device;
    a plurality of first conductivity type regions formed in said pocket region and comprising the base region of said semiconductor device; and
    a plurality of second conductivity type regions a first portion thereof formed in said plurality of first conductivity type regions and comprising the emitter region of said device and a second portion thereof formed in said pocket region and interdigitated with said plurality of first conductivity type regions, said second portion comprising portions of said collector region, said plurality of first conductivity type regions and said plurality of second conductivity type regions forming interdigitated base, emitter and collector regions.

2. The monolithic semiconductor device of claim 1 further comprising:
    interdigitated conductor members insulatingly overlying selected portions of said epitaxial layer and selectively contacting said base, emitter and collector regions.

3. The monolithic semiconductor device of claim 1 wherein said emitter regions and portions of said collector regions are of higher conductivity type than said pocket region.

4. The monolithic semiconductor device of claim 1 wherein the collector resistance $R_C$ of said device is approximately equal to $R_{NT}$ shunted by $R_S$, where $R_{NT}$ is approximately equal to the sum of the pocket region resistance, the unmodified epitaxial resistance in the collector region, the buried layer resistance and the deep collector contact resistance and $R_S$ is approximately equal to the sum of the spreading resistances between the interdigitated base and collector regions.

5. The monolithic semiconductor device of claim 4 wherein the collector resistance $R_C = R_{NT} R_S/(R_{NT} + R_S)$.

6. The monolithic semiconductor device of claim 1 wherein said first portion of said second conductivity regions is interconnected by a common region of second conductivity type.

7. The monolithic semiconductor device of claim 6 wherein said second portion of said second conductivity regions is interconnected by a common region of second conductivity type.

* * * * *